United States Patent [19]

Bratt et al.

[11] Patent Number: 4,498,131
[45] Date of Patent: Feb. 5, 1985

[54] DATA PROCESSING SYSTEM HAVING ADDRESSING MECHANISMS FOR PROCESSING OBJECT-BASED INFORMATION AND A PROTECTION SCHEME FOR DETERMINING ACCESS RIGHTS TO SUCH INFORMATION

[75] Inventors: Richard G. Bratt, Wayland; Edward S. Gavrin, Lincoln, both of Mass.; Stephen I. Schleimer, Chapel Hill, N.C.; John F. Pilat; Walter A. Wallach, Jr., both of Raleigh, N.C.; Michael S. Richmond, Pittsboro, N.C.; Richard A. Belgard, Saratoga, Calif.; David A. Farber, Durham, N.C.; John K. Ahlstrom, Mountain View; Steven J. Wallach, Saratoga, both of Calif.; Lawrence H. Katz, Oregon City, Oreg.; Douglas M. Wells, Chapel Hill; Craig J. Mundie, Cary, both of N.C.; Gerald F. Clancy, Saratoga, Calif.; David H. Bernstein, Ashland, Mass.; Thomas M. Jones, Chapel Hill, N.C.; Brett L. Bachman, Boston, Mass.

[73] Assignee: Data General Corporation, Westboro, Mass.

[21] Appl. No.: 266,408

[22] Filed: May 22, 1981

[51] Int. Cl.³ .............................................. G06F 9/22
[52] U.S. Cl. .................................................... 364/200
[58] Field of Search ... 364/200 MS File, 900 MS File

[56] References Cited

U.S. PATENT DOCUMENTS

| 3,905,023 | 9/1975 | Perpiglia | 364/200 |
| 4,206,503 | 6/1980 | Woods et al. | 364/200 |
| 4,354,225 | 10/1982 | Frieder | 364/200 |
| 4,398,243 | 8/1983 | Holberger et al. | 364/200 |

Primary Examiner—Raulfe B. Zache
Assistant Examiner—Archie E. Williams, Jr.
Attorney, Agent, or Firm—Robert F. O'Connell

[57] ABSTRACT

A digital data processing system has a memory organized into objects containing at least operands and instructions. Each object is identified by a unique and permanent identifier code which identifies the data processing system and the object. The system utilizes unique addressing mechanisms the addresses of which have object fields, offset fields and length fields for specifying the location and the total number of bits of an addressed object. The system uses a protection technique to prevent unauthorized access to objects by users who are identified by a subject number which identifies the user, a process of the system for executing the user's procedure, and the type of operation of the system to be performed by the user's procedure. An access control list for each object includes an access control list entry for each subject having access rights to the object and means for confirming that a particular active subject has access rights to a particular object before permitting access to the object.

2 Claims, 1 Drawing Figure

DATA PROCESSING SYSTEM HAVING ADDRESSING MECHANISMS FOR PROCESSING OBJECT-BASED INFORMATION AND A PROTECTION SCHEME FOR DETERMINING ACCESS RIGHTS TO SUCH INFORMATION

CROSS REFERENCE TO RELATED APPLICATIONS

The present patent application is related to other patent applications assigned to the assignee of the present application.

BACKGROUND OF THE INVENTION

1. Field of the Invention

The present invention relates to a digital data processing system and, more particularly, to a multiprocess digital data processing system in which information, including operands and instructions, can be organized as object-based information which is addressed by addresses containing object, offset and length fields and which includes protection means for preventing unauthorized access by a user to objects of another user.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation. In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data proccessing system each time a program is executed, and must then be frequently retranslated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBOL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure structure and operation of prior systems have not allowed the systems to be easily modified or adapted to meet particular data processing requirements. Such modifications may include changes in internal memory capacity, such as the addition or deletion of special purpose subsystems, for example, floating point or array processors. In addition, such modifications have significantly effected the users interface with the system. Ideally, the actual physical structure and operation of the data processing system should not be apparent at the user interface.

The present invention provides data processing system improvements and features which solve the above-described problems and limitations.

The digital computer system of the present invention includes a memory system comprising mass storage devices and one or more processors connected to the memory system. The memory system is organized into objects containing data items, e.g., operands and instructions, each object being identified by an object identifier. Locations of data items in the memory system are specified by means of the object identifier for the object containing the data item. Objects are addressed by addresses containing object fields, offset fields and length fields for specifying the location and number of bits in an accessed object. General register files are divided into vertically ordered registers having parallel-operating and addressed parts for storing the object, offset and length fields.

Access to the data items in objects is controlled by protection mechanisms of the system. When the digital computer system processes data in an object, it does so for a subject representing an entity using the computer system. An access control list associated with each object defines sets of subjects in a set of memory operations which a subject in a given set of subjects may perform on data items in the object. A memory operation on a data item in an object succeeds only if there is an access control list entry associated with the object which allows the subject for whom the processor is performing the memory operation to perform that operation on the data in the object.

It is thus an object of the present invention to provide an improved data processing system.

It is another object of the present invention to provide a data processing system capable of use in large, interconnected data processing networks.

It is yet another object of the present invention to provide an improved addressing mechanism suitable for use in large, interconnected data processing networks.

It is a further object of the present invention to provide an improved information protection mechanism.

It is still another object of the present invention to provide a simplified and flexible user interface to a data processing system.

It is yet a further object of the present invention to provide an improved mechanism for referring to operands.

It is a still further object of the present invention to provide an instruction structure allowing efficient data processing system operation with a plurality of high level user languages.

It is a further object of the present invention to provide data processing internal mechanisms protected from user interference.

It is yet another object of the present invention to provide a data processing system having a flexible internal structure capable of multiple, concurrent operations.

Other objects, advantages and features of the present invention will be understood by those of ordinary skill in the art, after referring to the following detailed description of the preferred embodiments and drawings wherein:

Figure 1:
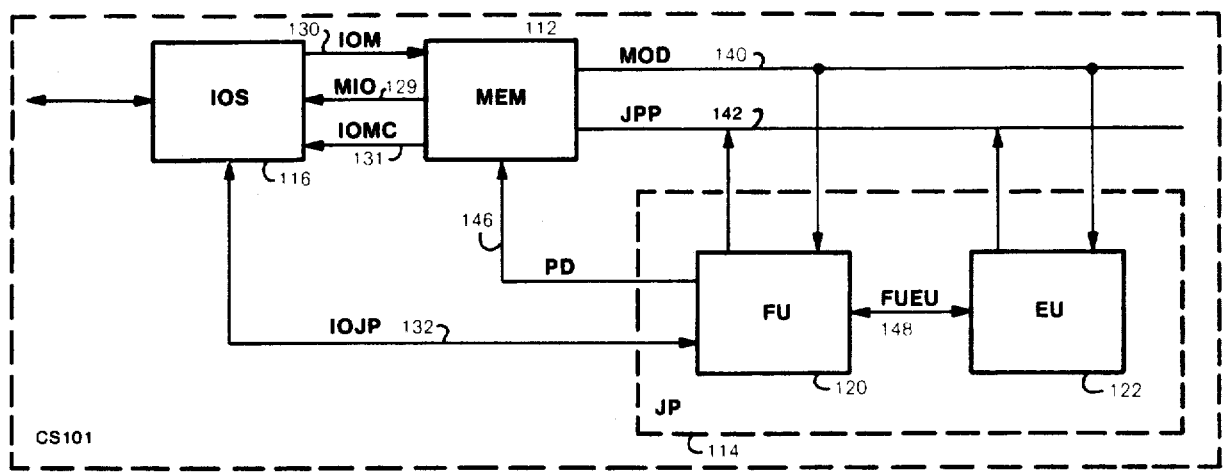
FIG. 1 is a partial block diagram of a computer system incorporating the present invention.

This application incorporates by reference the entire application, Ser. No. 266,402, filed on May 22, 1981, of Baxter et al., now issued as U.S. Pat. No. 4,455,602, on June 19, 1984.

More particularly, attention is directed to FIGS. 4, 5, 12, 19, 102, 106A-106C, 109, 202, 238 and 239 of the drawings in application Ser. No. 266,402, and to that part of the desciptive portion of the specification, particularly at pages 48-50, 56, 74-76, 87 et seq., 119, 140-143, 154 et seq., 375-379, 380 et seq. and 395 et seq. thereof, which relate to the subject matter of the claims herein.

What is claimed is:

1. In a digital computer system including processor means for performing operations on operands, memory means for storing operands and instructions for directing said operations, said memory means being organized into objects for containing operands and instructions, bus means for conducting operands and instructions between said memory means and said processor means, and I/O means for conducting operands between said digital computer system and devices external to said digital computer system, said processor means comprising:

ALU means connected to said bus means for performing said operations, addressing means connected to said bus means for providing addresses for controlling the transfer of operands and instructions between said memory means and said processor means, each of said addresses comprising an object field for identifying an object, an offset field for specifying a first number of information bits of offset relative to the start of said object, and a length field for specifying an second number of information bits of said object following said first number of information bits to be transferred between said memory means and said processor means, and microcode control means for storing sequences of microinstructions for controlling said processor means and responsive to said instructions for providing said sequences of microinstructions to said processor means, said ALU means including general register file means connected to said bus means for storing selected operands and addreses, said general register file means comprising a plurality of vertically ordered registers vertically divided into three parallel-operating and addresed parts, a first part of said general register file means comprising first register file means for storing object fields of said addresses, a second part of said general register file means comprising second register file means for storing offset fields of said addresses and said operands, and a third part of said general register file means comprising third register file means for storing length field of said addresses, and address ALU means connected to said general register file means and to said bus means and responsive to first sequences of microinstructions for performing operations on said addresses, said objects containing operands as data objects and instructions as procedure objects, and said processor means including protection means for preventing a user, currently using said digital computer system to execute a program comprising at least one procedure object, from obtaining unauthorized access to objects of another user, said protection means including subject number memory means responsive to the operation of said processor means for storing a currently active subject number of a plurality of subject numbers, each subject number corresponding to and identifying one of a plurality of subjects, each subject comprising the combination of (1) a user of said digital computer system, (2) a process of said digital computer system for executing a procedure of said user, and (3) the type of operation to be performed by said digital computer system in response to an instruction of a procedure of said user, and said currently active subject number identifies (1) the user currently utilizing said digital computer system, (2) the process currently executing a procedure of said user's program, and (3) the type of operation to be performed by said digital computer system in response to a current instruction of a procedure of said user's program, protection memory means for storing at least one access control list, each access control list corresponding to an object and comprising at least one access control entry, each access control entry corresponding to a subject having access rights to said object and containing the access rights of said subject to said object, and access right confirmation means responsive to a currently active subject number and to the operations of said processor means for indexing said protection means in response to a current instruction of a procedure of said user's program when said said current instruction requests access to an object and for comparing the access rights of the currently active subject to the access control list associated with said object.

2. The digital computer system of claim 1, wherein said processor means further comprises protection cache means connected to said bus means and responsive to the operation of said processor means and to a currently active subject number for storing access rights read from said protection memory means and for comparing access rights of said currently active subject to a selected object.

* * * * *